(12) United States Patent  
Chuang et al.

(10) Patent No.: US 8,450,137 B2  
(45) Date of Patent: May 28, 2013

(54) METHOD FOR REDUCING TILT OF TRANSPARENT WINDOW DURING MANUFACTURING OF IMAGE SENSOR

(75) Inventors: Chun-Hua Chuang, Hsin-Chu Hsien (TW); Yao-Nien Chuang, Hsin-Chu Hsien (TW); Tiao-Mu Hsu, Hsin-Chu Hsien (TW); Chien-Wei Chang, Hsin-Chu Hsien (TW); Chien-Hen Lin, Hsin-Chu Hsien (TW); Chen-Pin Peng, Hsin-Chu Hsien (TW); Chung-Hsien Hsin, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 0 days.

(21) Appl. No.: 13/403,159

(22) Filed: Feb. 23, 2012

(65) Prior Publication Data

US 2012/0220065 A1    Aug. 30, 2012

Related U.S. Application Data

(60) Provisional application No. 61/446,355, filed on Feb. 24, 2011.

(51) Int. Cl.  
*H01L 21/00*    (2006.01)

(52) U.S. Cl.  
USPC ............ 438/65; 438/106; 438/118; 438/121; 438/125; 257/E31.127; 257/E31.097; 257/E31.117

(58) Field of Classification Search  
USPC ............ 438/65, 106, 118, 121, 125; 257/677, 257/680, 704, 710, 783, E21.504, E23.128, 257/E31.097, E31.117, E31.127  
See application file for complete search history.

(56) References Cited

U.S. PATENT DOCUMENTS

| | | | |
|---|---|---|---|
| 6,509,636 B1 * | 1/2003 | Tsai et al. ...................... | 257/678 |
| 2004/0244192 A1 * | 12/2004 | Hsin et al. ...................... | 29/854 |
| 2006/0273249 A1 * | 12/2006 | Webster et al. ............... | 250/239 |

* cited by examiner

*Primary Examiner* — Charles Garber  
*Assistant Examiner* — Abdulfattah Mustapha  
(74) *Attorney, Agent, or Firm* — Juan Carlos A. Marquez; Stites & Harbison PLLC

(57) ABSTRACT

The present invention discloses a method for reducing the tilt of a transparent window during manufacturing of an image sensor. The method includes the following steps: providing a semimanufacture of the image sensor; carrying out a preheating process; carrying out an adhesive spreading process; carrying out a transparent window closing process; and carrying out a packaging process. By carrying out the preheating process, the environmental conditions can be stabilized during the adhesive spreading process and the transparent window closing process such that the transparent window can be kept highly flat after combining. By the implementation of the present invention, the chance of tilt and crack of the transparent window during manufacturing of the image sensor can be reduced, thereby achieving the goal for a better yield rate.

12 Claims, 10 Drawing Sheets

METHOD FOR REDUCING TILT OF TRANSPARENT WINDOW DURING MANUFACTURING OF IMAGE SENSOR

BACKGROUND OF THE INVENTION

1. Technical Field

The present invention relates to a method for reducing the tilt of a transparent window during manufacturing of an image sensor, and more particularly, to a method for reducing the tilt of a transparent window during manufacturing of an image sensor that can improve the yield rate by carrying out a preheating process to stabilize the process environment.

2. Description of Related Art

FIG. 1A is a schematic view illustrating a structure of a conventional image sensor. FIG. 1B is a schematic view illustrating tilting and consequent fracture of a transparent window during a process of manufacturing the conventional image sensor. FIG. 1C is a schematic view illustrating tilting of the transparent window and consequent overflow of an adhesive during the process of manufacturing the conventional image sensor.

As shown in FIG. 1A, the conventional image sensor 100 substantially includes a circuit substrate 10 (e.g., a printed circuit board; PCB), an image sensor die 20, a transparent window 30 and an encapsulant 40. The image sensor die 20 is disposed on the circuit substrate 10 and is electrically connected to circuits on the circuit substrate 10 via metal wirings 25 through wire bonding, and the transparent window 30 is disposed above a photosensitive region (not shown) of the image sensor die 20 by means of an adhesive 26 such as an epoxy resin, and then the metal wirings 25 and side edges of the image sensing die 20 and the transparent window 30 are encapsulated by the encapsulant 40 through molding.

However, as shown in FIG. 1B, if the transparent window 30 adhered above the photosensitive region (not shown) of the image sensing die 20 is placed in an out-of-level state (e.g., inclined in the lateral direction) during the molding process, then the tilt of the transparent window 30 with respect to the image sensor die 20 or the circuit substrate 10 will become overly large and this makes it easy to cause fracture of the transparent window 30 when the mold 50 is pressed downwards during the molding process, which decreases the yield rate of image sensors.

Additionally, as shown in FIG. 1C, the air in a space enclosed by the transparent window 30, the image sensor die 20 and the adhesive 26 during the molding process tends to expand non-uniformly when heated by a high environmental temperature. This will not only push the transparent window 30 to cause tilting of the transparent window 30 but also push the adhesive 26 outwards to cause overflow of the adhesive 26, thus degrading the yield rate of image sensors.

BRIEF SUMMARY OF THE INVENTION

The present invention is a method for reducing the tilt of a transparent window during manufacturing of an image sensor. According to the method, a preheating process is carried out to release the air pressure inside a space in the vicinity of the image sensor die so that the enclosed space formed when the transparent window is closed will not expand at the high temperature of subsequent processes to cause unevenness of the transparent window. In this way, the tilt of the transparent window can be reduced and fracture of the transparent window during the transparent window closing process can be avoided, thus improving the yield rate.

The present invention provides A method for reducing the tilt of a transparent window during manufacturing of an image sensor, comprising the following steps: providing a semimanufacture of the image sensor, which comprises a circuit substrate and an image sensor die, wherein the circuit substrate has a supporting surface and a bottom surface, a plurality of first conductive contacts are provided on the supporting surface, and the image sensor die comprises: a first surface attached to the supporting surface; a second surface having a photosensitive region; and a plurality of second conductive contacts disposed outside the photosensitive region and electrically connected to the first conductive contacts via metal wirings respectively; carrying out a preheating process by placing the semimanufacture into an environment at a specific temperature; carrying out an adhesive spreading process by, after the preheating process, spreading an adhesive onto the second surface around the photosensitive region without covering the photosensitive region; carrying out a transparent window closing process by, after the adhesive spreading process, placing a transparent window on the adhesive and curing the adhesive to fix the transparent window onto the second surface and to form an air chamber between the image sensor die and the transparent window; and carrying out a packaging process by packaging the semimanufacture and the transparent window with an encapsulant.

Through implementation of the present invention, at least the following effects can be achieved:

1. environment factors for the semimanufacture during the adhesive spreading process can be made stable to reduce the tilt of the transparent window after the transparent window closing process;

2. the tilt of the transparent window due to expansion of the air inside the air chamber after the transparent window closing process can be avoided; and 3. occurrence of the adhesive overflow after the transparent window closing process can be reduced.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

Figure 1A:
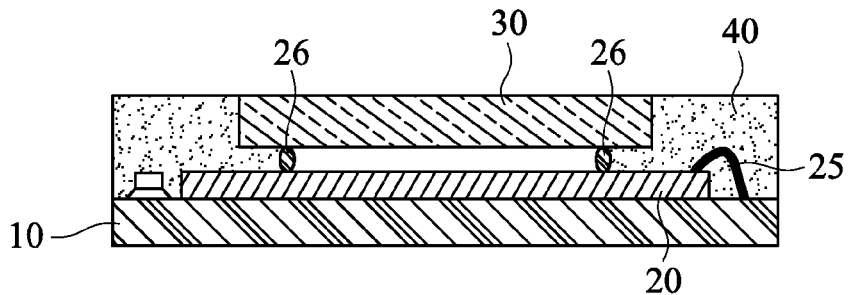
FIG. 1A is a schematic view illustrating a structure of a conventional image sensor.
Figure 1B:
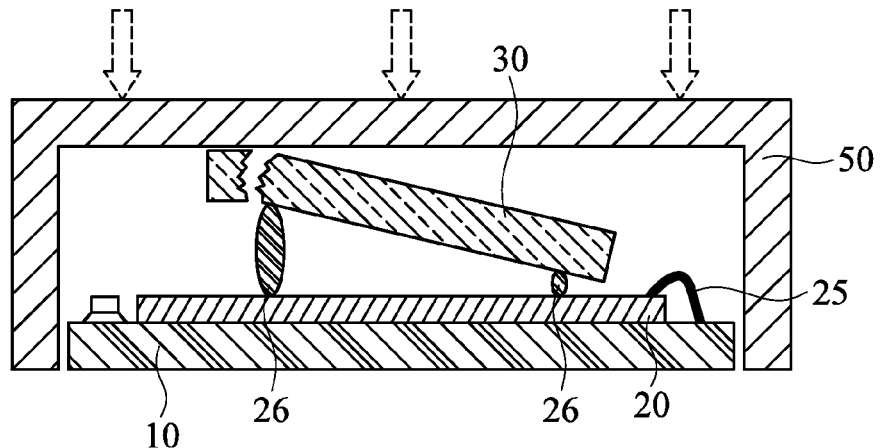
FIG. 1B is a schematic view illustrating tilting and consequent fracture of a transparent window during a process of manufacturing the conventional image sensor.
Figure 1C:
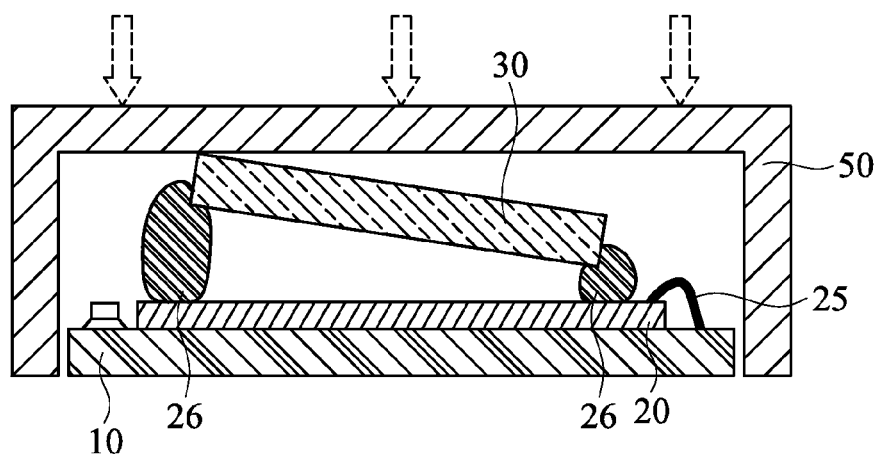
FIG. 1C is a schematic view illustrating tilting of the transparent window and consequent overflow of an adhesive during the process of manufacturing the conventional image sensor.
Figure 2:
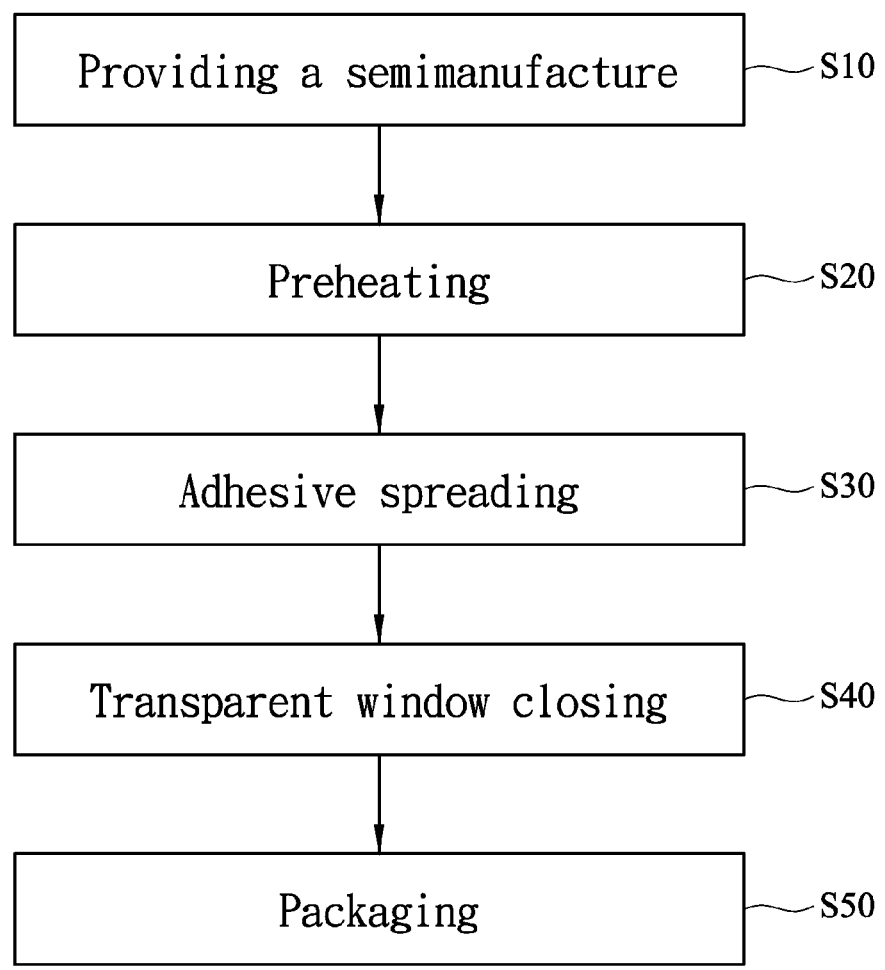
FIG. 2 is a flowchart diagram of a method for reducing the tilt of a transparent window during manufacturing of an image sensor according to an embodiment of the present invention.

As shown in FIG. 2, this embodiment is a method for reducing the tilt of a transparent window during manufacturing of an image sensor, which comprises the following steps of: providing a semimanfuacture (step S10); carrying out a preheating process (step S20); carrying out an adhesive spreading process (step S30); carrying out a transparent window closing process (step S40); and carrying out a packaging process (step S50).

Figure 3:
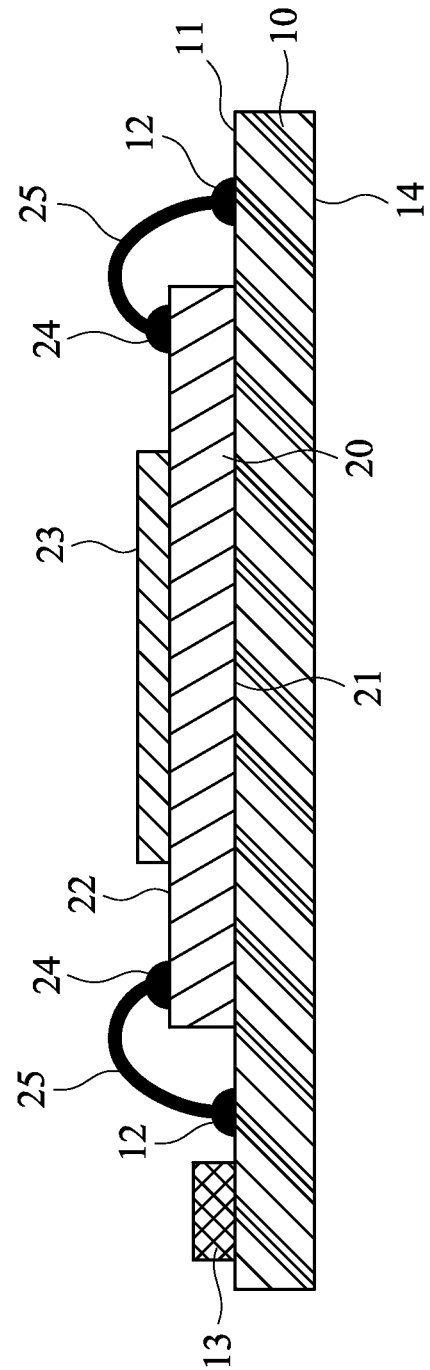
FIG. 3 is a schematic view of a semimanufacture of an image sensor according to an embodiment of the present invention.

As shown in FIG. 3, a semimanufacture is provided (step S10). The semimanufacture 200 provided in this embodiment is a semimanufacture of an image sensor, which comprises a circuit substrate 10 and an image sensor die 20.

The circuit substrate 10 has a supporting surface 11 and a bottom surface 14. A plurality of first conductive pads 12 is disposed on the supporting surface 11 for electrical connection in the wire bonding process and the plurality of first conductive pads is electrically connected to circuits on the supporting surface 11. Additionally, a drive integrated circuit (IC) and passive elements 13 may also be optionally disposed on the supporting surface 11 and electrically connected to the circuits on the supporting surface 11.

The image sensor die 20 may be a complementary metal oxide semiconductor (CMOS) image sensor die or a charge coupled device (CCE), and comprises: a first surface 21; a second surface 22; and a plurality of second conductive contacts 24.

The first surface 21 is the lower surface of the image sensor die 20, and is attached to the supporting surface 11 through use of an adhesive so that the image sensor die 20 is attached to the circuit substrate 10. The second surface 22 is the upper surface of the image sensor die 20, and has a photosensitive region 23 for receiving and sensing light rays. The second conductive contacts 24 are disposed outside the photosensitive region 23 and electrically connected to the first conductive contacts 12 on the first surface 21 by metal wirings 25 respectively. Thus, the image sensor die 20 can be electrically connected to the drive IC and the passive elements 13 through the circuits on the supporting surface 11.

A preheating process is carried out (step S20) by placing the semimanufacture 200 into an environment at a specific temperature. The environment at the specific temperature may be an oven, and the specific temperature may range between 35° C. and 45° C. By preheating the semimanufacture 200, the air temperature around the second surface 22 and the supporting surface 11 can be increased to a temperature range which is the same as the environment temperature in the subsequent adhesive spreading process and the subsequent transparent window closing process so as to release the air pressure in the space around the second surface 22 and the supporting surface 11. This can prevent the air around the second surface 22 and the supporting surface 11 from being influenced by the temperature rise in the subsequent adhesive spreading process or the subsequent transparent window closing process to cause non-uniform expansion and consequent tilting of the transparent window (not shown). This can also prevent the enclosed space formed in the transparent window closing process from expanding due to the temperature rise to cause unevenness of the transparent window, and prevent occurrence of overflow of the adhesive.

Figure 4A:
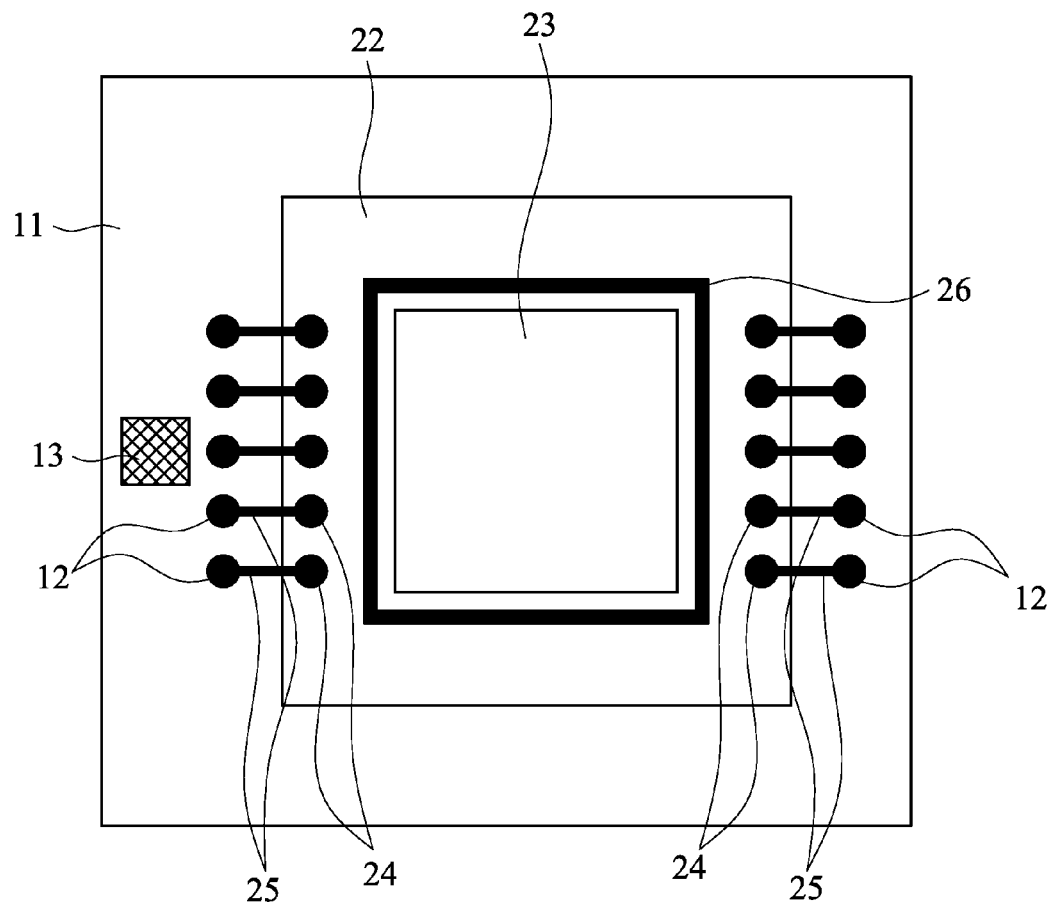
FIG. 4A is a top view of a semimanufacture of an image sensor obtained after an adhesive spreading process according to an embodiment of the present invention.

As shown in FIG. 4A, an adhesive spreading process is carried out (step S30) after the preheating process (step S20) by spreading an adhesive 26 onto the second surface 22 around the photosensitive region 23 without covering the photosensitive region 23. During the adhesive spreading process, the environment temperature may still be maintained at the specific temperature which is the same as that of the preheating process (e.g., between 35° C. and 45° C.). The adhesive 26 may be applied in regions between the photosensitive region 23 and the second conductive contacts 24 to form a □-shaped pattern, which looks like a frame-shaped pattern. Thereby, the photosensitive region 23 after being packaged can be accommodated in the space formed by the adhesive 26 and the transparent window (not shown) to prevent the photosensitive region 23 from being influenced by external factors.

Figure 4B:
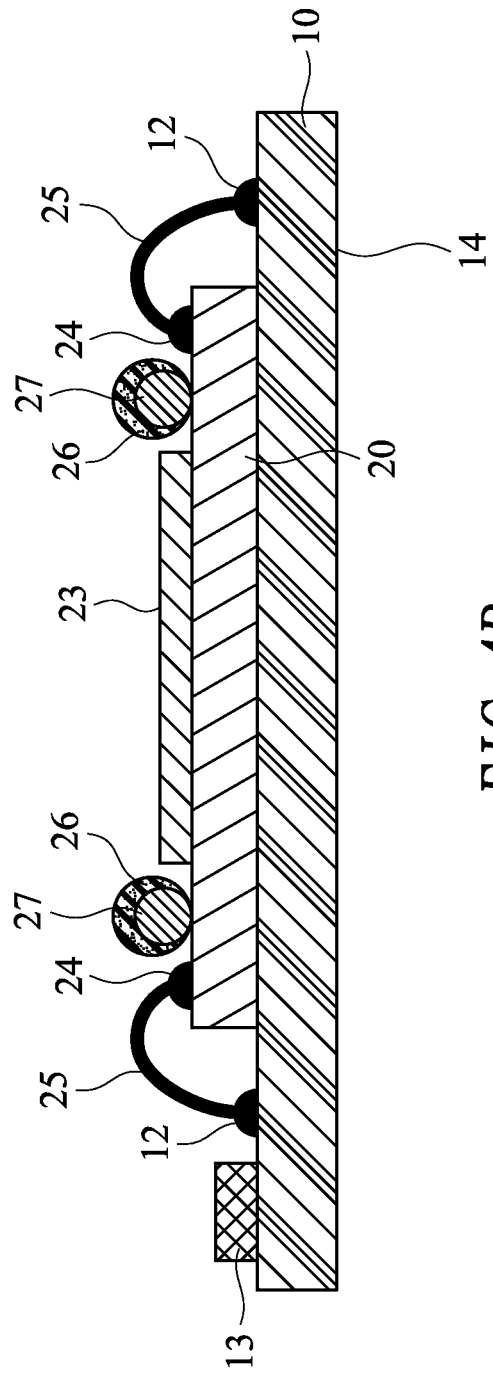
FIG. 4B is a schematic view illustrating a structure of the semimanufacture of the image sensor obtained after the adhesive spreading process according to the embodiment of the present invention.

As shown in FIG. 4B, a plurality of ball spacers 27 may be further added into the adhesive 26 to keep a most appropriate distance between the transparent window (not shown) and the image sensing die 20 so that the tilt of the transparent window (not shown) is controlled to be within a reasonable range.

Figure 5:
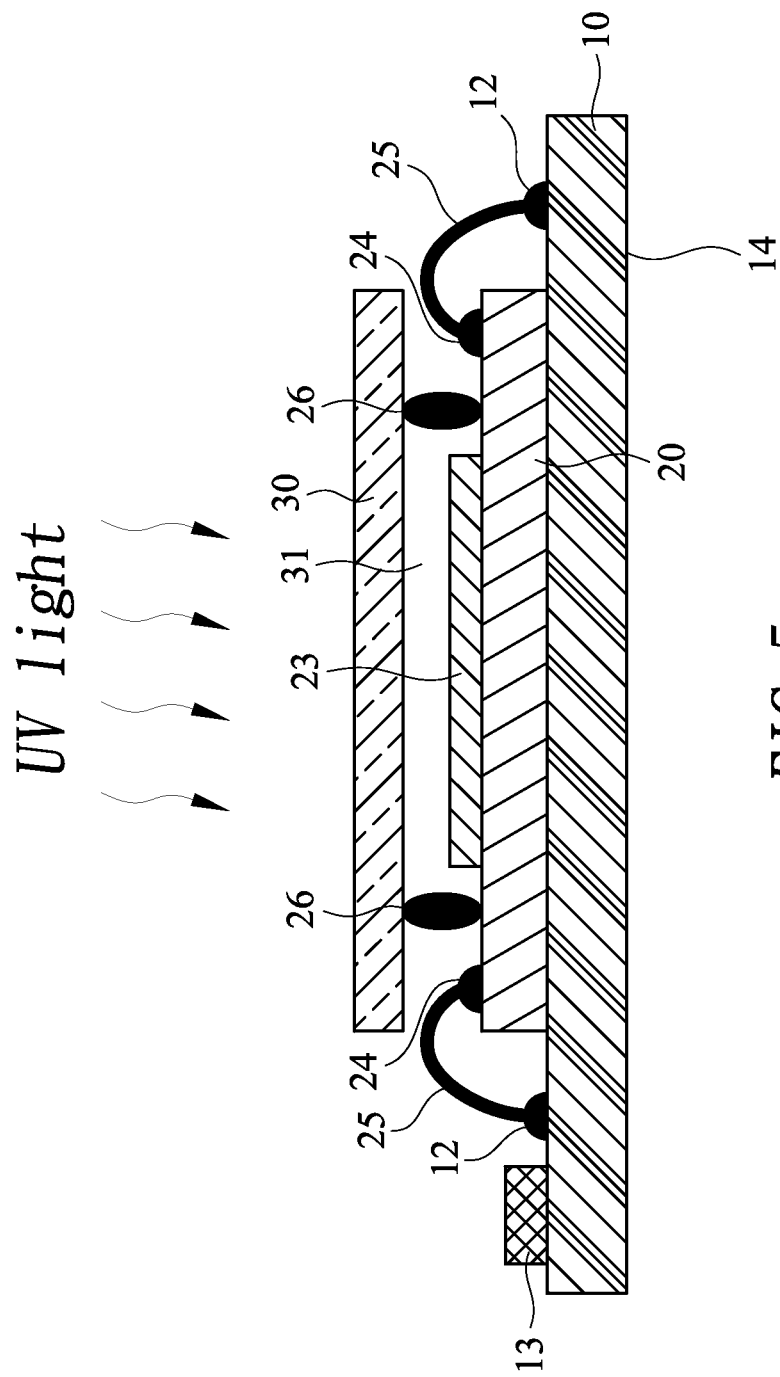
FIG. 5 is a schematic view of a semimanufacture of an image sensor obtained after a transparent window closing process according to an embodiment of the present invention.

Then as shown in FIG. 5, a transparent window closing process (step S40) is carried out. The transparent window 30 may be a glass board. The transparent window closing process is carried out after the adhesive spreading process (S30) by placing the transparent window 30 on the adhesive 26 and curing the adhesive 26 to fix the transparent window 30 onto the second surface 22 and to form an air chamber 31 between the image sensor die 20 and the transparent window 30. During the transparent window closing process, the environment temperature may also be maintained at the specific temperature which is the same as that of the preheating process (e.g., between 35° C. and 45° C.).

The adhesive 26 may be a photocurable adhesive, and particularly an ultraviolet (UV) curable adhesive; and in the transparent window closing process, the UV curable adhesive is cured through irradiation of UV light rays.

Finally, a packaging process (step S50) is carried out by packaging the semimanufacture and the transparent window 30 with an encapsulant 40 through use of a molding process or a dispensing technology.

Figure 6A:
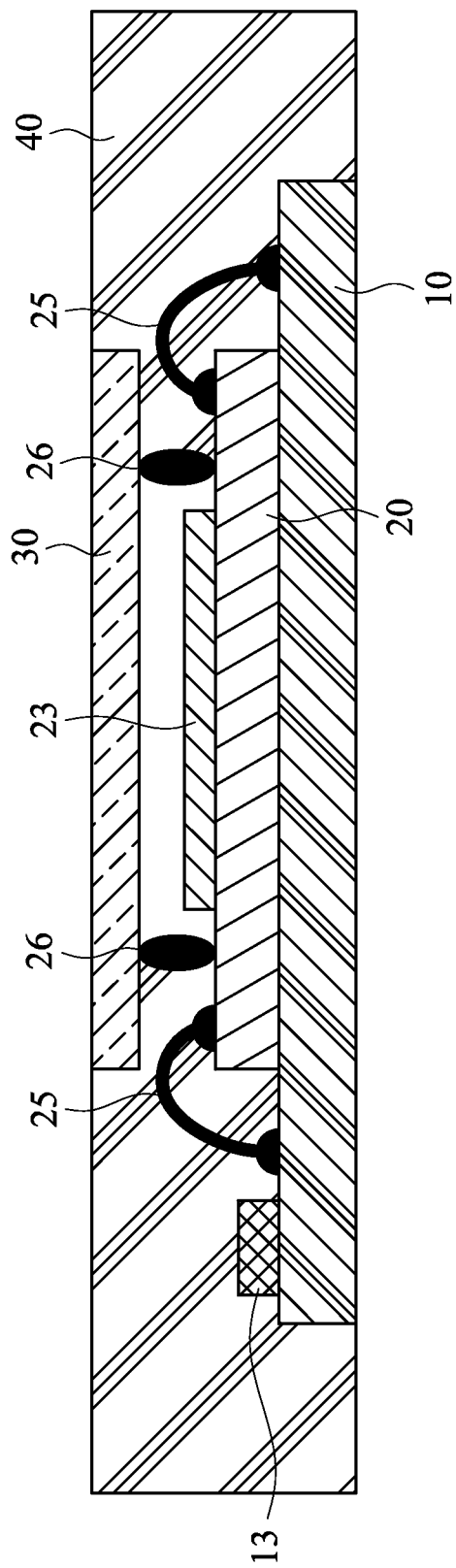
FIG. 6A is a view illustrating a first aspect of an image sensor obtained after a packaging process according to an embodiment of the present invention.

As shown in FIG. 6A, the encapsulant 40 may be applied to cover side edges of the semimanufacture, the adhesive 26, and the transparent window 30. More specifically, a space formed by side edges of the transparent window 30 and a bottom surface of the transparent window 30, side edges of the circuit substrate 10 and a top surface of the circuit substrate 10, and the periphery of the □-shaped region applied with the adhesive 26 may be encapsulated by the encapsulant 40. Thus, by using the encapsulant 40 to cover the side edges of the circuit substrate 10, the side edges of the circuit substrate 10 can be prevented from being damaged due to impacts.

Figure 6B:
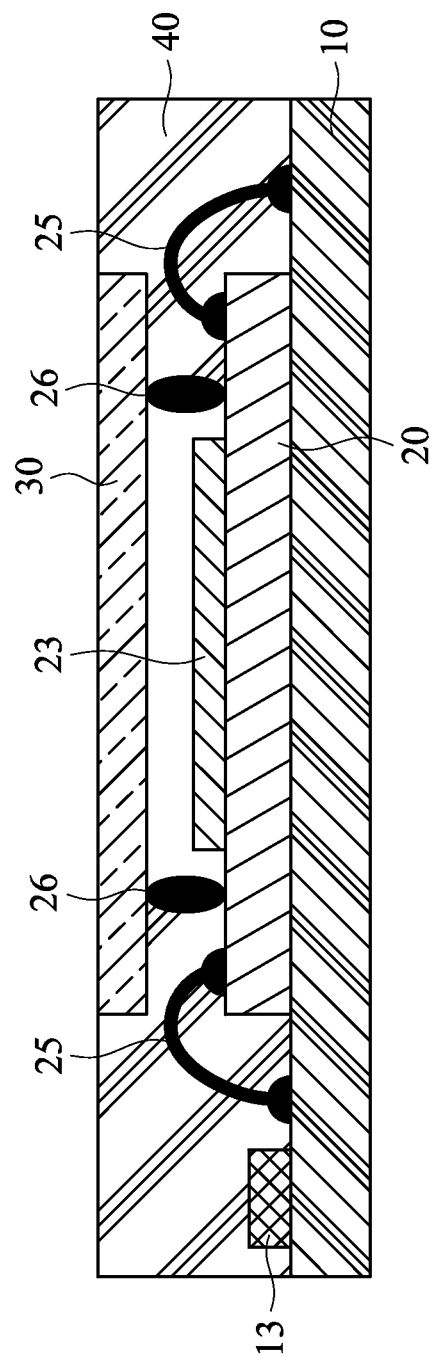
FIG. 6B is a view illustrating a second aspect of an image sensor obtained after the packaging process according to the embodiment of the present invention.

Further, as shown in FIG. 6B, the encapsulant 40 may also be disposed on the circuit substrate 10 and cover the side edges of the image sensor die 20, the adhesive 26, and the transparent window 30. More specifically, a space formed by side edges of the transparent window 30 and the bottom surface of the transparent window 30, the top surface of the circuit substrate 10 (but except for the side edges of the circuit substrate 10) and the periphery of the □-shaped region applied with the adhesive 26 may be encapsulated by the encapsulant 40.

Figure 7A:
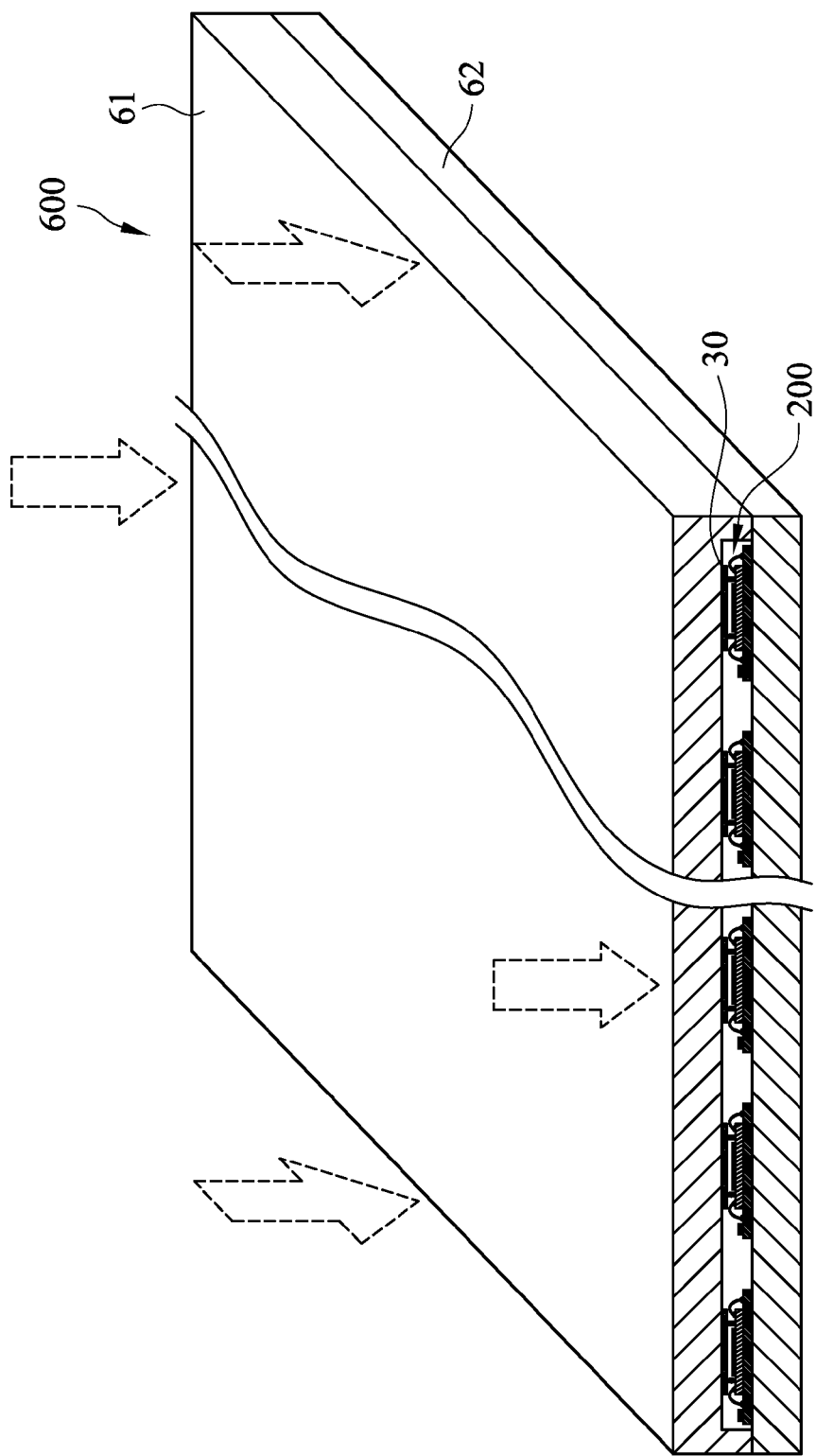
FIG. 7A is a cross-sectional view illustrating a large-scale packaging mold in combination with semimanufactures of image sensors according to an embodiment of the present invention.
Figure 7B:
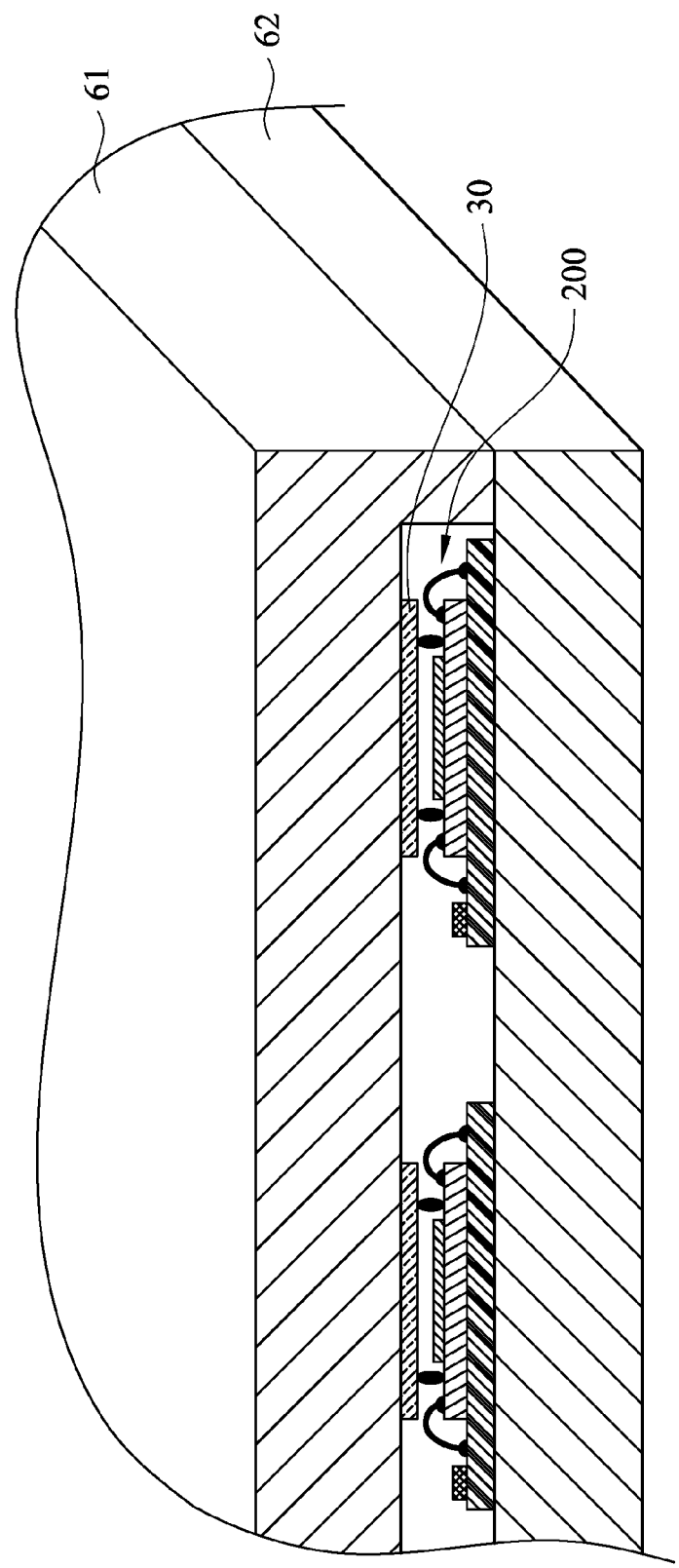
FIG. 7B is a partially enlarged view of FIG. 7A.

As shown in FIG. 7A and FIG. 7B, in this embodiment, semimanufactures 200 that have been subjected to the transparent window closing process may also be arranged on a base 62 of a large-scale packaging mold 600, and then a top cover 61 of the large-scale packaging mold 600 is joined with the base 62 to carry out the packaging process (step S50) so as to achieve the purpose of mass production.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of the present invention. Hence, all equivalent modifications or amendments made to the aforesaid embodiment should fall within the scope of the appended claims.

What is claimed is:

1. A method for reducing the tilt of a transparent window during manufacturing of an image sensor, comprising the following steps:
   providing a semimanufacture of the image sensor, which comprises a circuit substrate and an image sensor die, wherein the circuit substrate has a supporting surface and a bottom surface, a plurality of first conductive contacts are provided on the supporting surface, and the image sensor die comprises: a first surface attached to the supporting surface; a second surface having a photosensitive region; and a plurality of second conductive contacts disposed outside the photosensitive region and electrically connected to the first conductive contacts via metal wirings respectively;
   carrying out a preheating process by placing the semimanufacture into an environment at a specific temperature;
   carrying out an adhesive spreading process by, after the preheating process, spreading an adhesive onto the second surface around the photosensitive region without covering the photosensitive region;
   carrying out a transparent window closing process by, after the adhesive spreading process, placing a transparent window on the adhesive and curing the adhesive to fix the transparent window onto the second surface and to form an air chamber between the image sensor die and the transparent window; and
   carrying out a packaging process by packaging the semimanufacture and the transparent window with an encapsulant.

2. The method for reducing the tilt of a transparent window during manufacturing of an image sensor of claim 1, wherein the image sensor die is a complementary metal oxide semiconductor (CMOS) image sensor die or a charge coupled device (CCD).

3. The method for reducing the tilt of a transparent window during manufacturing of an image sensor of claim 1, wherein the specific temperature ranges between 35° C. and 45° C.

4. The method for reducing the tilt of a transparent window during manufacturing of an image sensor of claim 1, wherein an environmental temperature in the adhesive spreading process ranges between 35° C. and 45° C.

5. The method for reducing the tilt of a transparent window during manufacturing of an image sensor of claim 1, wherein in the adhesive spreading process, the adhesive is spread in regions between the photosensitive region and the second conductive contacts, and the adhesive forms a □-shaped pattern.

6. The method for reducing the tilt of a transparent window during manufacturing of an image sensor of claim 1, wherein a plurality of ball spacers is further added in the adhesive.

7. The method for reducing the tilt of a transparent window during manufacturing of an image sensor of claim 1, wherein an environment temperature in the transparent window closing process ranges between 35° C. and 45° C.

8. The method for reducing the tilt of a transparent window during manufacturing of an image sensor of claim 1, wherein the transparent window is a glass board.

9. The method for reducing the tilt of a transparent window during manufacturing of an image sensor of claim 1, wherein the adhesive is a photocurable adhesive.

10. The method for reducing the tilt of a transparent window during manufacturing of an image sensor of claim 9, wherein the photocurable adhesive is an ultraviolet (UV) curable adhesive, and in the transparent window closing process, the UV curable adhesive is cured through irradiation of UV light rays.

11. The method for reducing the tilt of a transparent window during manufacturing of an image sensor of claim 1, wherein the encapsulant is applied to cover side edges of the semimanufacture, the adhesive and the transparent window in the packaging process.

12. The method for reducing the tilt of a transparent window during manufacturing of an image sensor of claim 1, wherein the encapsulant is disposed on the circuit substrate and covers the side edges of the image sensor die, the adhesive and the transparent window in the packaging process.

* * * * *